United States Patent [19]

Cunningham et al.

[11] 3,924,14

[45] Dec. 2, 197

[54] CONSTANT RISE TIME CONTROLLER FOR CURRENT PULSE

[75] Inventors: James M. Cunningham, St. Paul; Kenneth A. Dorn, Eagan; James A. Howe, Burnsville; Charles L. Mortenson, Inver Grove Heights, all of Minn.

[73] Assignee: Sperry Rand Corporation, New York, N.Y.

[22] Filed: Nov. 29, 1974

[21] Appl. No.: 527,978

[52] U.S. Cl. ............... 307/263; 307/228; 307/270; 307/310; 323/1

[51] Int. Cl.[2] ............................................ H03K 5/12

[58] Field of Search ........... 307/228, 263, 270, 310; 323/1

[56] References Cited

UNITED STATES PATENTS

| | | | |
|---|---|---|---|
| 3,311,900 | 3/1967 | Gaunt, Jr. | 307/263 |
| 3,344,321 | 9/1967 | Sumilas | 307/270 |
| 3,436,563 | 4/1969 | Regitz | 307/270 |

*Primary Examiner*—Stanley D. Miller, Jr.
*Attorney, Agent, or Firm*—Kenneth T. Grace; Thomas J. Nikolai; Marshall M. Truex

[57] ABSTRACT

A circuit that ensures that the rise time of the leading edge of a temperature-compensated word drive current pulse is constant irrespective of drive current pulse amplitude variation with temperature is disclosed. The circuit samples a variable amplitude reference voltage that is generated by a temperature sensor located in a magnetic memory, such as a core, film or plated-wire memory stack, and generates a correspondingly variable amplitude drive current pulse. The circuit includes a current-mirror comprising two directly-coupled-base transistors to ensure proportional current amplification as required by an associated RC charging circuit that controls the drive current pulse generating output transistor. The proportional current amplification provides the necessary variation in the charging current to fully charge the charging capacitor over the same duration irrespective of drive current pulse amplitude. A pre-charging transistor also ensures rapid turn-off of the output transistor to maintain an abrupt trailing edge of the drive current pulse.

6 Claims, 3 Drawing Figures

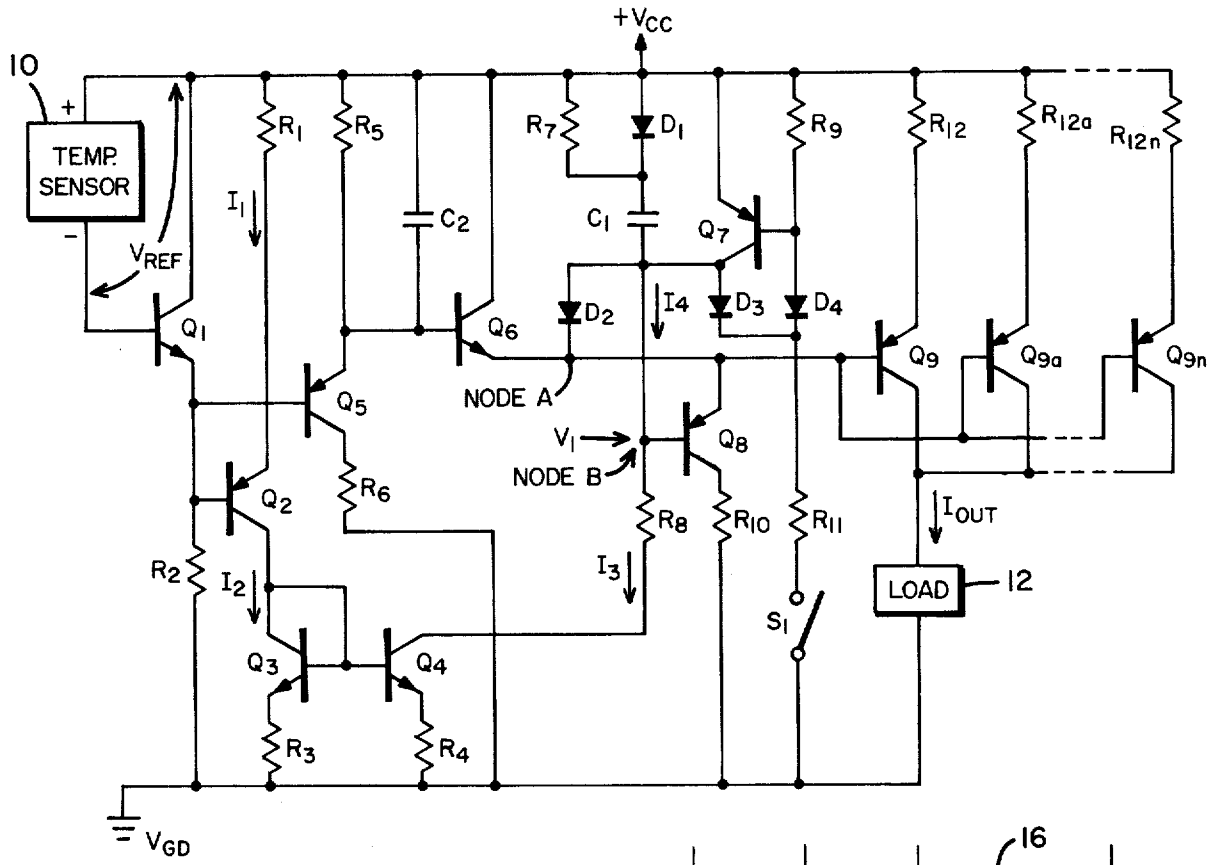
Fig. 1
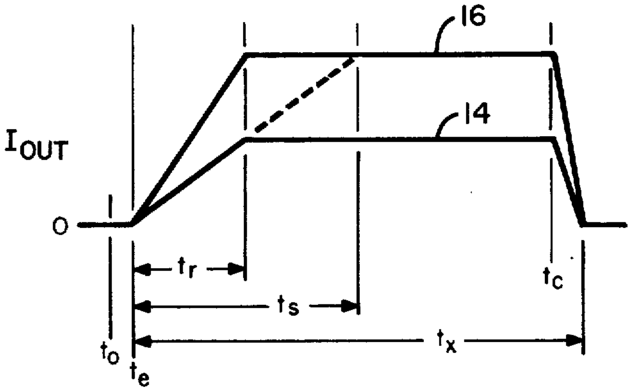
Fig. 2
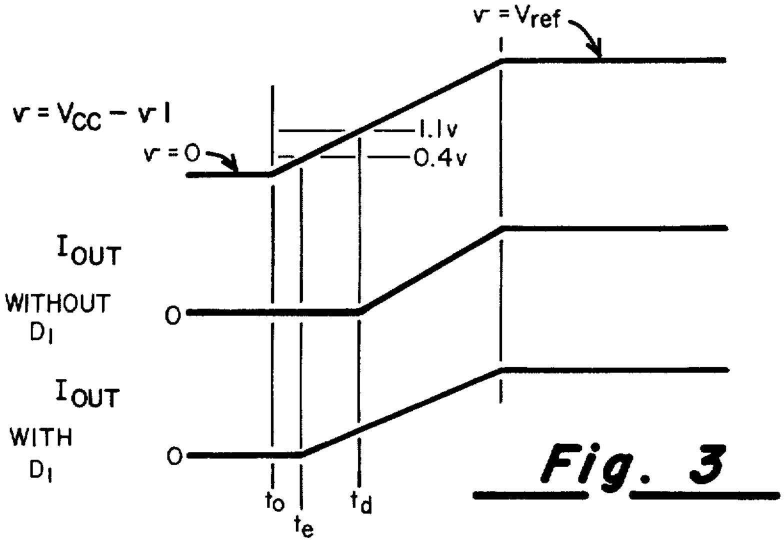

CONSTANT RISE TIME CONTROLLER FOR CURRENT PULSE

BACKGROUND OF THE INVENTION

In the prior art it is known that as the temperature within a memory stack changes the operating characteristics of the memory elements that form the memory stack vary. This variation of temperature requires that the operating temperature of the memory stack be monitored and that a corresponding variation in the drive current pulse characteristic utilized to operate the memory elements within the memory stack be varied in a corresponding manner. Such a temperature compensated memory system is disclosed in the J. A. Howe U.S. Pat. No. 3,488,529. Additionally, it is known that a change in the characteristics of the drive current pulse wave form can produce a variation in the wave form of the memory stack output signals derived therefrom causing corresponding problems in selecting the proper strobe time and amplitude characteristics of the output signal as a variation of the wave form characteristics of the drive current signal. Such need for a reliable drive current signal pulse wave form has been recognized by the W. M. Regitz U.S. Pat. No. 3,436,563. However, it has been the prior art practice to use a drive current pulse with a uniformly increasing leading edge. This solution, however, in a temperature compensated memory system induces an error producing drive current signal wave form in that the rise time of the leading edge thereof then varies as a function of the variation of the amplitude of the drive current pulse. This variation in the rise time of the leading edge of the drive current pulse with amplitude of the drive current pulse induces a timing problem with the so-produced output signal in that the strobe pulse is not always timed at the optimum relationship with the so-produced memory stack output signal. Accordingly, it is desirable that the drive current pulse have a leading edge with a constant rise time irrespective of drive current pulse amplitude to ensure optimum operating characteristics of the associated memory system. The present invention is directed towards a circuit that ensures such optimum operating conditions.

SUMMARY OF THE INVENTION

The circuit of the present invention samples a variable amplitude reference voltage that is generated by a temperature sensor located in a memory stack. The circuit then generates a temperature conpensated drive current pulse having the necessary variable amplitude and having a leading edge whose rise time is constant irrrespective of the drive current pulse amplitude. The circuit utilizes a first path through a plurality of transistors for achieving the desired variation in drive current pulse amplitude with variation in the reference signal that is produced by the temperature sensor and a second rise time control path through a plurality of transistors and a charging capacitor for ensuring a constant rise time in the leading edge of the drive current pulse irrespective of variation in the amplitude of the drive current pulse. The rise time control path is coupled to a current-mirror formed of two directly-coupled-base transistors that ensure proportional current amplification as required by the associated charging capacitor. An additional pre-charging transistor is utilized to ensure that the trailing edge of the drive current pulse has an abrupt, substantially uniform fall time as is desired for memory system timing.

BRIEF DESCRIPTION OF THE DRAWINGS

FIG. 1 is the circuit schematic of the constant rise time controller of the present invention.

FIG. 2 is an illustration of the wave form of the drive current pulse generated by the circuit of FIG. 1 whereby the rise time of the leading edge of the drive current pulse is constant irrespective of the level of the drive current pulse amplitude.

FIG. 3 is an illustration of the manner in which the diode $D_1$ of FIG. 1 effects the operation of the circuit thereof.

DESCRIPTION OF THE PREFERRED EMBODIMENTS

With particular reference to FIG. 1 there is presented the circuit schematic of the constant rise time controller of the present invention. The circuit of FIG. 1 samples a variable amplitude reference voltage $V_{REF}$ that is generated by a temperature sensor 10 located in the memory stack of an e.g., plated-wire memory system and couples to load 12 (the drive line selection matrix and the drive lines located in the memory stack) a drive current pulse $I_{OUT}$whose amplitude corresponds to and varies with the instantaneous amplitude of the reference signal $V_{REF}$, the rise time of the leading edge of which is substantially constant irrespective of the particular amplitude of the drive current pulse $I_{OUT}$. The instantaneous amplitude of the reference signal $V_{REF}$ during the duration of the current pulse, $t_x$, establishes the corresponding amplitude of the relatively constant amplitude drive current pulse $I_{OUT}$. The pulse length of the drive current pulse $I_{OUT}$ is determined by the length of time switch $S_1$ is open, while the constant rise time and fall time of the drive current pulse $I_{OUT}$ are determined by circuit parameters. The circuit includes a current-mirror comprised of transistors $Q_3$ and $Q_4$ to ensure the proportional current amplification of current $I_2$ as required by the associated charging circuit, formed of the current $I_3$ that is proportional to the reference signal $V_{REF}$, and the capacitor $C_1$ to charge the charging capacitor $C_1$ over the same duration, i.e., rise time, irrespective of drive current pulse $I_{OUT}$ amplitude. The circuit is further comprised of a rise time control circuit including a first branch including transistors $Q_1$, $Q_2$, $Q_3$ and a second branch including transistor $Q_4$, resistors $R_7$, $R_8$, capacitor $C_1$, and diode $D_1$ and of an amplitude control circuit including transistors $Q_1$, $Q_5$, $Q_6$ and load transistors $Q_9$ – $Q_{9n}$. Transistor $Q_7$ is the switching gate that turns the drive current pulse $I_{OUT}$ ON and OFF under control of the circuit timing input represented by switch $S_1$ while transistor $Q_8$ functions as a pre-driver for the output stage formed by load transistors $Q_9$ – $Q_{9n}$. Transistor $Q_7$ holds the circuit OFF when switch $S_1$ is closed and it functions as a pre-driver via diode $D_2$to ensure a relatively abrupt trailing edge fall time.

The circuit is turned ON at time $t_0$ by opening switch $S_1$, where switch $S_1$is normally closed, which turns OFF transistor $Q_7$ – diodes $D_3$ and $D_4$ are anti-saturation diodes to aid transistor $Q_7$ to turn OFF faster so as to provide an abrupt, sharp initiation of the drive current pulse $I_{OUT}$. Current $I_3$, which is of a constant amplitude (DC) and is proportional to the output of the reference signal $V_{REF}$ of temperature sensor 10, then starts charging capacitor $C_1$ at a linear rate that is proportional to the instantaneous amplitude of the reference signal $V_{REF}$. The voltage across capacitor $C_1$ is clamped by transistor $Q_6$ when the voltage across resistors $R_{12}$ – $R_{12n}$ is equal to the reference signal $V_{REF}$. Because both the rate at which capacitor $C_1$ charges at and the final level at which the voltage across resistor $R_{12}$ clamps at are proportional to the reference signal $V_{REF}$, the time from when switch $S_1$ is opened to when the output drive current pulse $I_{OUT}$ achieves its final relatively constant amplitude level remains essentially constant irrespective of the final amplitude level.

CIRCUIT THEORY

Amplitude regulation:

The reference signal $V_{REF}$ appears across the current determining Resistors $R_{12}$ – $R_{12n}$ when transistor $Q_7$ is OFF, then $$I_{OUT} = \left(\frac{\beta_9}{\beta_9 + 1}\right)\left(\frac{V_{CC} - V_2}{R_{12}}\right) = \left(\frac{\beta_9}{\beta_9 + 1}\right)\left(\frac{V_{REF}+V_{BE1}-V_{BE5}+V_{BE6}-V_{BE9}}{R_{12}}\right)$$

For $\beta_9 >> 1$ and $V_{BE1} + V_{BE6} \approx V_{BE5} + V_{BE9}$ $$I_{OUT} = \frac{V_{REF}}{R_{12}}, \text{ or } I_{OUT} \propto V_{REF}$$

Rise time, control turn-on and turn-off:

$$I_1 = \frac{V_{REF} + V_{BE1} - V_{BE2}}{R_1} \approx \frac{V_{REF}}{R_1}$$

$$I_2 = \left(\frac{\beta_2}{\beta_2 + 1}\right) I_1 \approx \frac{V_{REF}}{R_1}.$$

Now $Q_3$ is connected as a diode to cancel $V_{BE4}$, so for $I_2 >> I_{B4}$:

$$I_3 = \frac{I_2R_3+V_{BE3}-V_{BE4}}{R_4} \approx \frac{I_2R_3}{R_4} \approx \frac{R_3}{R_4}\left(\frac{V_{REF}}{R_1}\right), \text{ or } I_3 \propto V_{REF}$$

Switch $S_1$ is normally closed, and is preferably a transistor or logic gate, and maintains transistor $Q_7$ in its conducting or ON state. When transistor $Q_7$ is ON, it shorts the base electrode of transistor $Q_8$ to the supply voltage $V_{CC}$, maintaining transistor $Q_8$ and transistors $Q_9$ – $Q_{9n}$ in their non-conducting or OFF state. Now, when switch $S_1$ is opened, capacitor $C_1$ starts charging from $[V_{CC} - V_{CE7}]$ towards ground potential. The bias levels of the circuit (resistors $R_1$, $R_2$, $R_5$, $R_6$, $R_8$, $R_9$, $R_{10}$, $R_{11}$, are all biasing resistors utilized to establish the various bias levels desired) are selected so that $I_{B8} << I_3$, so that $I_4 \approx I_3$
$I_3 \propto V_{REF}$, so
$I_4 \propto V_{REF}$.

Now with $i = c\ dV/dT$ and since $I_4$ = a constant,
$dV_1/dt$ = constant = $I_4/C_1$ and therefore $dV_1/dt \propto V_{REF}$.

This relationship implies that if the reference signal $V_{REF}$ doubles in amplitude, the rate of charge of capacitor $C_1$ doubles and therefore, the time for $I_{OUT}$ to increase from 0 amplitude to its full amplitude level remains constant irrespective of its final amplitude level.

As illustrated in FIG. 2 with a drive current pulse $I_{OUT}$ having a pulse length $t_x$, in the prior art when there was utilized a linear drive current pulse rise as in the aforementioned W. M. Regitz U.S. Pat. No. 3,436,563, the rise time of the leading edge thereof would vary with change in amplitude such as where it would have a rise time $t_r$ with an amplitude level 14 and a rise time $t_s$ as with an amplitude level 16. This is in contrast to the circuit of the present invention wherein the rise time $t_r$ of the drive current pulse $I_{OUT}$ would be $t_r$ irrespective of the amplitude being of a level 14 or 16.

A diode $D_1$ is added to provide an initial step in the signal $V_1$ to offset the value that the signal $V_1$ must charge to before transistor $Q_9$ turns ON because of the baseemitter voltage of transistor $Q_8$ and transistors $Q_9$ – $Q_{9n}$.

$(V_{CC} - V_1)$ just before switch $S_1$ is opened = $V_{CE7}$ (Sat) ≈ 0.3V $(V_{CC} - V_1)$ required to turn ON transistor $Q_9 = V_{BE8} + V_{BE9} \approx 1.4V$ $(V_{CC} - V_1)$ just after switch $S_1$ is opened = $V_{CE7}$ (Sat) $+ V_{D1} \approx 1.0V$ Without diode $D_1$ in the circuit, capacitor $C_1$ must charge a total of 1.4V – 0.3V = 1.1V before transistor $Q_9$ turns ON. With diode $D_1$ in the circuit as illustrated, capacitor $C_1$ need only charge a total of 1.4V – 1.0V = 0.4V before transistor $Q_9$ turns ON. This relationship is illustrated in detail in FIG. 3 and ensures faster turn-on and more uniform 10% and 90% points in the rise time of the drive current pulse $I_{OUT}$.

When the level of voltage $V_1$ changes from $V_{CC} - V_{CE7}$ to $V_{CC} - V_{REF} - V_{BE1} + V_{BE5} - V_{BE6} - V_{BE8}$ transistor $Q_6$ clamps the level of voltage $V_1$ (capacitor $C_2$ decouples the clamp voltage). This operation clamps the base electrodes of transistor $Q_8$ and transistors $Q_9$ – $Q_{9n}$ and inititates the regulated amplitude level or flat-top portion of the drive current pulse $I_{OUT}$.

To terminate the pulse length of drive current pulse $I_{OUT}$, switch $S_1$ is closed at time $t_c$ turning transistor $Q_7$ ON. This turning on of transistor $Q_7$ rapidly turns transistors $Q_9$ – $Q_{9n}$ OFF by charging the bases of transistors $Q_9$ – $Q_{9n}$ via diode $D_2$ and turning OFF transistor $Q_8$, which will, in turn, hold transistors $Q_9$ – $Q_{9n}$ OFF. Capacitor $C_1$ is then discharged through resistor $R_7$ preparing the circuit for the next cycle as timed by the opening at time $t_0$ and the closing at time $t_c$ of switch $S_1$.

What is claimed is:

1. In a controller for maintaining the rise time of the leading edge of an output pulse independently of the amplitude thereof, the combination comprising:

a first source of a constant amplitude first reference signal;

a second source of a varying amplitude second reference signal coupled to said first reference signal for controlling said second reference signal to vary its amplitude with respect to said first reference signal;

a plurality of load transistors, each having a control electrode and a pair of output electrodes, having directly intercoupled control electrodes forming a first node, means coupling each separate first output electrode to said first reference signal and having directly intercoupled second output electrodes;

load means coupled to the directly intercoupled second output electrodes of said load transistors;

a current-mirror circuit including first and second transistors, each having a control electrode and a pair of output electrodes, with their control electrodes directly intercoupled, and the first output electrode of said first transistor directly coupled to said directly intercoupled control electrodes;

a rise time control circuit including first and second branches:

said first branch including a third transistor, having a control electrode and a pair of output electrodes for coupling said second reference signal to the first output electrode of said first transistor and generating an amplified first current signal whose amplitude varies as the amplitude of said second reference signal;

said second branch including serial coupled first capacitor means and first resistor means coupling said first reference signal to the first output electrode of said second transistor and a second node formed intermediate said first capacitor means and said first resistor means;

a fourth transistor, having a control electrode and a pair of output electrodes, means for directly coupling its first output electrode to said first reference signal, means for directly coupling its second output electrode to said second node and means including a first diode means for coupling its second output electrode to said first node;

switch means coupled to the control electrode of said fourth transistor and normally keeping said fourth transistor in its conducting state for substantially shorting said second node to said first reference signal as a second current signal flows through the junction of its first and second output electrodes when said fourth transistor is in its normally conducting state or for alternatively charging said first capacitor means at a constant rise time irrespective of the amplitude of said second current signal when said fourth transistor is switched into its non-conducting state.

2. The controller of claim 1 further including a second diode means coupled in parallel across said first resistor means for coupling said first capacitor means to said first reference signal.

3. The controller of claim 1 further including an amplitude control circuit including fifth and sixth transistors, each having a control electrode and a pair of output electrodes, means for coupling the control electrode of said fifth transistor directly to the second output electrode of said third transistor, means for coupling the first output electrode of said fifth transistor directly to the control electrode of said sixth transistor and means for coupling the first output electrode of said sixth transistor directly to said first node, means for coupling the first output electrode of said fifth transistor to said first reference signal and means for coupling the second output electrode of said sixth transistor directly to said first reference signal.

4. The controller of claim 1 further including a seventh transistor having a control electrode and a pair of output electrodes, means for coupling the control electrode of said seventh transistor directly to said second node, and means for coupling the first output electrode of said seventh transistor directly to said first node.

5. In a controller for maintaining the rise time of the leading edge of an output pulse independently of the amplitude thereof, the combination comprising:

a first source of a constant amplitude first reference signal;

a second source of a varying amplitude second reference signal coupled to said first reference signal for controlling said second reference signal to vary its amplitude with respect to said first reference signal;

a plurality of load transistors having directly intercoupled base electrodes forming a first node, means coupling each separate emitter electrode to said first reference signal and having directly intercoupled collector electrodes;

load means coupled to the directly intercoupled collector electrodes of said load transistors;

a current-mirror circuit including first and second transistors with their base electrodes directly intercoupled, and the collector electrode of said first transistor directly coupled to said directly intercoupled base electrodes;

a rise time control circuit including first and second branches:

said first branch including a third transistor coupled in an emitter follower stage and a fourth transistor coupled in a collector loaded stage, said third and fourth transistors cascaded to couple said second reference signal to the collector electrode of said first transistor for generating an amplified first current signal whose amplitude varies as the amplitude of said second reference signal;

said second branch including serial coupled first capacitor means and first resistor means coupling said first reference signal to the collector electrode of said second transistor and a second node formed intermediate said first capacitor means and said first resistor means;

a fifth transistor, means for directly coupling its emitter electrode to said first reference signal, means for directly coupling its collector electrode to said second node and means including a diode for coupling its collector electrode to said first node;

switch means coupled to the base electrode of said fifth transistor and normally keeping said fifth transistor it its conducting state for substantially shorting said second node to said first reference signal as said second current signal flows through its emitter-collector junction when said fifth transistor is in its normally conducting state or for alternatively charging said first capacitor means at a constant rise time irrespective of the amplitude of said second current signal when said fifth transistor is switched into its non-conducting state.

6. In a controller for maintaining the rise time of the leading edge of an output pulse independently of the amplitude thereof, the combination comprising:

a first source of a constant amplitude first reference signal;

a second source of a constant amplitude second reference signal;

a third source of a varying amplitude third reference signal coupled to said first reference signal for controlling said third reference signal to vary its amplitude with respect to said first reference signal;

a plurality of load transistors having directly intercoupled collector electrodes and having directly intercoupled base electrodes that form a first node;

load means for coupling the directly intercoupled collector electrodes of said load transistors to said second reference signal;

first biasing means for coupling the separate emitter electrodes of said load transistors to said first reference signal;

a current-mirror circuit including first and second transistors with their base electrodes directly intercoupled, and the collector electrode of said first transistor directly coupled to said directly intercoupled base electrodes;

a rise time control circuit including first and second branches:

said first branch including a third transistor coupled in an emitter follower stage coupling said third reference signal to the collector electrode of said first transistor for conducting an amplified first current signal whose amplitude varies as the amplitude of said third reference signal;

said second branch including serial coupled first capacitor means and first resistor means serially coupling said first reference signal to the collector electrode of said second transistor for conducting an amplified second current signal whose amplitude varies as a function of said first current signal, and a second node formed intermediate said first capacitor means and said first resistor means;

an amplitude control circuit including a fourth transistor, means for coupling the emitter electrode of said third transistor to the base electrode of said fourth transistor, means for directly coupling the collector electrode of said fourth transistor to said first reference signal and means for directly coupling the emitter electrode of said fourth transistor to said first node;

a fifth transistor, means for directly coupling the emitter electrode of said fifth transistor to said first reference signal, means for directly coupling the collector electrode of said fifth transistor to said second node, and means including a diode for coupling the collector electrode of said fifth transistor to said first node;

a sixth transistor, means for directly coupling the base electrode of said sixth transistor to said second node, means for directly coupling the emitter electrode of said sixth transistor to said first node and means for coupling the collector electrode of said sixth transistor to said second reference signal;

switch means coupling the base electrode of said fifth transistor to said second reference signal and normally keeping said fifth transistor in its conducting state for substantially shorting said second node to said first reference signal as said second current signal flows through its emitter-collector junction when said fifth transistor is in its normally conducting state or for alternatively charging said first capacitor means at a constant rise time irrespective of the amplitude of said second current signal when said fifth transistor is switched into its non-conducting state.

* * * * *

UNITED STATES PATENT OFFICE

CERTIFICATE OF CORRECTION

PATENT NO. : 3,924,143

DATED : December 2, 1975

INVENTOR(S) : J. M. Cunningham, et al

It is certified that error appears in the above-identified patent and that said Letters Patent are hereby corrected as shown below:

IN THE PRINTED PATENT

Column 4, Line 18, "$(V_{CC} - V_1)$ required to turn ON transistor $Q_9 = V_{BEQ} + V_{BE9} \approx 1.4V$" should be -- $(V_{CC} - V_1)$ required to turn ON transistor $Q_9 = V_{BE8} + V_{BE9} \approx 1.4V$ --.

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*